United States Patent
Jung et al.

(10) Patent No.: US 9,941,364 B2
(45) Date of Patent: Apr. 10, 2018

(54) HIGH VOLTAGE SEMICONDUCTOR DEVICE AND METHOD OF MANUFACTURING THE SAME

(71) Applicant: Dongbu Hitek Co. Ltd., Seoul (KR)

(72) Inventors: Jin Hyo Jung, Seoul (KR); Jung Hyun Lee, Seoul (KR); Bum Seok Kim, Seoul (KR); Seung Ha Lee, Seoul (KR); Chang Hee Kim, Seoul (KR)

(73) Assignee: DB HITEK CO., LTD., Seoul, Korea (KR)

( * ) Notice: Subject to any disclaimer, the term of this patent is extended or adjusted under 35 U.S.C. 154(b) by 32 days.

(21) Appl. No.: 15/091,952

(22) Filed: Apr. 6, 2016

(65) Prior Publication Data

US 2016/0351706 A1 Dec. 1, 2016

(30) Foreign Application Priority Data

May 28, 2015 (KR) .................... 10-2015-0074769

(51) Int. Cl.
*H01L 29/40* (2006.01)
*H01L 29/66* (2006.01)
*H01L 29/78* (2006.01)

(52) U.S. Cl.
CPC ......... *H01L 29/402* (2013.01); *H01L 29/404* (2013.01); *H01L 29/665* (2013.01);
(Continued)

(58) Field of Classification Search
CPC ............ H01L 29/0882; H01L 29/1095; H01L 29/66681; H01L 29/7816; H01L 29/0653;
(Continued)

(56) References Cited

U.S. PATENT DOCUMENTS

2008/0182394 A1* 7/2008 Yang .............. H01L 29/7835 438/510
2012/0175679 A1* 7/2012 Marino ............ H01L 29/402 257/194

(Continued)

FOREIGN PATENT DOCUMENTS

KR 1020050055223 A 6/2005
KR 100752194 8/2007

OTHER PUBLICATIONS

Machine translation of Korean Patent Publication KR 1020050055223 A.*
(Continued)

*Primary Examiner* — Bilkis Jahan
*Assistant Examiner* — Victor Barzykin
(74) *Attorney, Agent, or Firm* — Patterson Thuente Pedersen, P.A.

(57) ABSTRACT

In embodiments, a high voltage semiconductor device includes a gate structure disposed on a substrate, a source region disposed at a surface portion of the substrate adjacent to one side of the gate structure, a drift region disposed at a surface portion of the substrate adjacent to another side of the gate structure, a drain region disposed at a surface portion of the drift region spaced from the gate structure, and an electrode structure disposed on the drift region to generate a vertical electric field between the gate structure and the drain region.

12 Claims, 10 Drawing Sheets

(52) U.S. Cl.
CPC .... *H01L 29/66659* (2013.01); *H01L 29/7833* (2013.01); *H01L 29/7835* (2013.01)

(58) Field of Classification Search
CPC ............. H01L 29/0878; H01L 29/1087; H01L 29/402; H01L 29/456; H01L 29/4933; H01L 29/665; H01L 29/66719; H01L 29/7809; H01L 29/7812
See application file for complete search history.

(56) References Cited

U.S. PATENT DOCUMENTS

| | | | |
|---|---|---|---|
| 2013/0292763 A1* | 11/2013 | Chang | H01L 29/7816 257/335 |
| 2014/0070312 A1* | 3/2014 | Yang | H01L 29/7809 257/337 |
| 2014/6070312 | 3/2014 | Yang et al. | |
| 2015/0123199 A1* | 5/2015 | Chen | H01L 29/66681 257/339 |

OTHER PUBLICATIONS

Machine translation of KR1020050055223, Seo et. al., published Jun. 13, 2005.*
Korean Office Action, for Korean Application No. 20150074769, dated Jul. 20, 2016, 13 pages.
Grant of Patent, for Korean Application No. 20150074769, dated Nov. 26, 2016, 1 page.

\* cited by examiner

HIGH VOLTAGE SEMICONDUCTOR DEVICE AND METHOD OF MANUFACTURING THE SAME

CROSS-REFERENCE TO RELATED APPLICATION

This application claims priority to Korean Patent Application No. 10-2015-0074769, filed on May 28, 2015 and all the benefits accruing therefrom under 35 U.S.C. § 119, the contents of which are incorporated by reference in their entirety.

TECHNICAL FIELD

The present disclosure relates to a high voltage semiconductor device and a method of manufacturing the same, and more particularly, to a high voltage semiconductor device such as a drain extended metal oxide semiconductor (DEMOS) device and a method of manufacturing the same.

BACKGROUND

Generally, the DEMOS devices may be employed for applications such as power switching circuits. The DEMOS devices may include a drain extension region which substantially increases operating voltages for the devices.

FIG. 1 is a cross-sectional view illustrating a conventional DEMOS device.

Referring to FIG. 1, a conventional DEMOS device 10 may include a gate structure 20 formed on a substrate 12, drift regions 30 and 32 formed at surface portions of the substrate 12 adjacent to both sides of the gate structure 20, and source/drain regions 40 and 42 formed at surface portions of the drift regions 30 and 32.

Further, a gate spacer 22 may be formed on side surfaces of the gate structure 20, and insulating layer patterns 50 and 52 used as silicide blocking layers may be formed on the drift regions 30 and 32 and the gate spacer 22.

Meanwhile, when driving voltage and drain voltage are applied to the gate structure 20 and the drain region 42, respectively, impact ionization may occur in the drain region 42 and/or the drift region 32 adjacent to the drain region 42 due to electrons with sufficient kinetic energy. In detail, a lateral electric field generated by the drain voltage may provide electrons with sufficient kinetic energy between the source region 40 and the drain region 42, and new electron-hole pairs may thus be produced by the impact ionization in the drain region 42 and/or the drift region 32. Particularly, leakage current of the DEMOS device 10 through the substrate 12 may be increased by the impact ionization.

SUMMARY

The present disclosure provides a high voltage semiconductor device capable of reducing leakage current due to impact ionization and a method of manufacturing the same.

In accordance with an aspect of the claimed invention, a high voltage semiconductor device may include a gate structure formed on a substrate, a source region formed at a surface portion of the substrate adjacent to one side of the gate structure, a drift region formed at a surface portion of the substrate adjacent to another side of the gate structure, a drain region formed at a surface portion of the drift region spaced from the gate structure, and an electrode structure formed on the drift region to generate a vertical electric field between the gate structure and the drain region.

In accordance with some exemplary embodiments, a gate spacer may be formed on side surfaces of the gate structure and an electrode spacer may be formed on side surfaces of the electrode structure.

In accordance with some exemplary embodiments, a space between the gate structure and the electrode structure may be filled up with the gate spacer and the electrode spacer.

In accordance with some exemplary embodiments, an insulating layer pattern may be formed on a surface portion of the drift region exposed between the gate spacer and the electrode spacer.

In accordance with some exemplary embodiments, the drain region and the electrode structure may be electrically connected with each other.

In accordance with some exemplary embodiments, a voltage may be applied to the electrode structure to generate the vertical electric field.

In accordance with some exemplary embodiments, the gate structure may include a gate insulating layer formed on the substrate and a gate electrode formed on the gate insulating layer, and the electrode structure may include an insulating layer pattern formed on the drift region and an electrode pattern formed on the insulating layer pattern.

In accordance with some exemplary embodiments, the insulating layer pattern may be formed of the same material as the gate insulating layer, and the electrode pattern may be formed of the same material as the gate electrode.

In accordance with another aspect of the claimed invention, a high voltage semiconductor device may include a gate structure formed on a substrate, a first drift region formed at a surface portion of the substrate adjacent to one side of the gate structure, a source region formed at a surface portion of the first drift region spaced from the gate structure, a second drift region formed at a surface portion of the substrate adjacent to another side of the gate structure, a drain region formed at a surface portion of the second drift region spaced from the gate structure, a first electrode structure formed on the first drift region between the gate structure and the source region, and a second electrode structure formed on the second drift region between the gate structure and the drain region.

In accordance with some exemplary embodiments, a gate spacer may be formed on side surfaces of the gate structure, a first electrode spacer may be formed on side surfaces of the first electrode structure, and a second electrode spacer may be formed on side surfaces of the second electrode structure.

In accordance with some exemplary embodiments, spaces between the gate structure and the first and second electrode structures may be filled up with the gate spacer and the first and second electrode spacers.

In accordance with some exemplary embodiments, first and second insulating layer patterns may be formed on surface portions of the first and second drift regions exposed between the gate spacer and the first and second electrode spacers, respectively.

In accordance with some exemplary embodiments, the source region and the first electrode structure may be electrically connected with each other.

In accordance with some exemplary embodiments, a first voltage may be applied to the first electrode structure.

In accordance with some exemplary embodiments, the first electrode structure may be electrically floated.

In accordance with some exemplary embodiments, the drain region and the second electrode structure may be electrically connected with each other.

In accordance with some exemplary embodiments, a second voltage may be applied to the second electrode structure to generate a vertical electric field between the gate structure and the drain region.

In accordance with some exemplary embodiments, the gate structure may include a gate insulating layer formed on the substrate and a gate electrode formed on the gate insulating layer, the first electrode structure may include a first insulating layer pattern formed on the first drift region and a first electrode pattern formed on the first insulating layer pattern, and the second electrode structure may include a second insulating layer pattern formed on the second drift region and a second electrode pattern formed on the second insulating layer pattern.

In accordance with some exemplary embodiments, the first and second insulating layer pattern may be formed of the same material as the gate insulating layer, and the first and second electrode pattern may be formed of the same material as the gate electrode.

In accordance with still another aspect of the claimed invention, a method of manufacturing a high voltage semiconductor device may include forming a drift region at a surface portion of a substrate, forming a gate structure on the substrate to be disposed adjacent to the drift region, forming an electrode structure on the drift region to generate a vertical electric field in the drift region, the electrode structure being spaced from the gate structure, and forming a source region and a drain region adjacent to the gate structure and electrode structure, respectively, wherein the gate structure and the electrode structure are disposed between the source region and the drain region.

In accordance with still another aspect of the claimed invention, a method of manufacturing a high voltage semiconductor device may include forming a first drift region and a second drift region at surface portions of a substrate to be spaced from each other, forming a gate structure on the substrate between the first and second drift regions, forming a first electrode structure and a second electrode structure on the first and second drift regions to be spaced from both sides of the gate structure, respectively, and forming a source region and a drain region adjacent to the first and second electrode structures, respectively, wherein the first electrode structure, the gate structure and the second electrode structure are disposed between the source region and the drain region.

The above summary of the invention is not intended to describe each illustrated embodiment or every implementation of the present invention. The detailed description and claims that follow more particularly exemplify these embodiments.

BRIEF DESCRIPTION OF THE DRAWINGS

Exemplary embodiments can be understood in more detail from the following description taken in conjunction with the accompanying drawings, in which.

Figure 1:
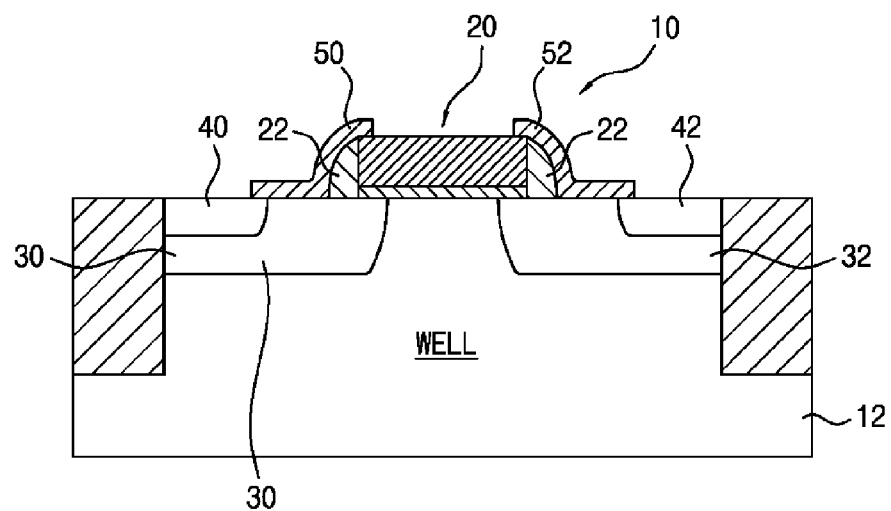
FIG. 1 is a cross-sectional view illustrating a conventional DEMOS device.

While embodiments are amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF EMBODIMENTS

Hereinafter, various embodiments of the invention will be described in more detail with reference to the accompanying drawings. The claimed invention may, however, be embodied in different embodiments and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. Unlike this, it will also be understood that when a layer, a film, a region or a plate is referred to as being 'directly on' another one, it is directly on the other one, and one or more intervening layers, films, regions or plates do not exist. Also, though terms like a first, a second, and a third are used to describe various components, compositions, regions and layers in various embodiments of the claimed invention are not limited to these terms.

Furthermore, and solely for convenience of description, elements may be referred to as "above" or "below" one another. It will be understood that such description refers to the orientation shown in the figure being described, and that in various uses and alternative embodiments these elements could be rotated or transposed in alternative arrangements and configurations.

In the following description, the technical terms are used only for explaining specific embodiments while not limiting the scope of the claimed invention. Unless otherwise defined herein, all the terms used herein, which include technical or scientific terms, may have the same meaning that is generally understood by those skilled in the art.

The depicted embodiments are described with reference to schematic diagrams of some embodiments of the claimed invention. Accordingly, changes in the shapes of the diagrams, for example, changes in manufacturing techniques and/or allowable errors, are sufficiently expected. Accordingly, embodiments of the claimed invention are not described as being limited to specific shapes of areas described with diagrams and include deviations in the shapes and also the areas described with drawings are entirely schematic and their shapes do not represent accurate shapes and also do not limit the scope of the claimed invention.

Figure 2:
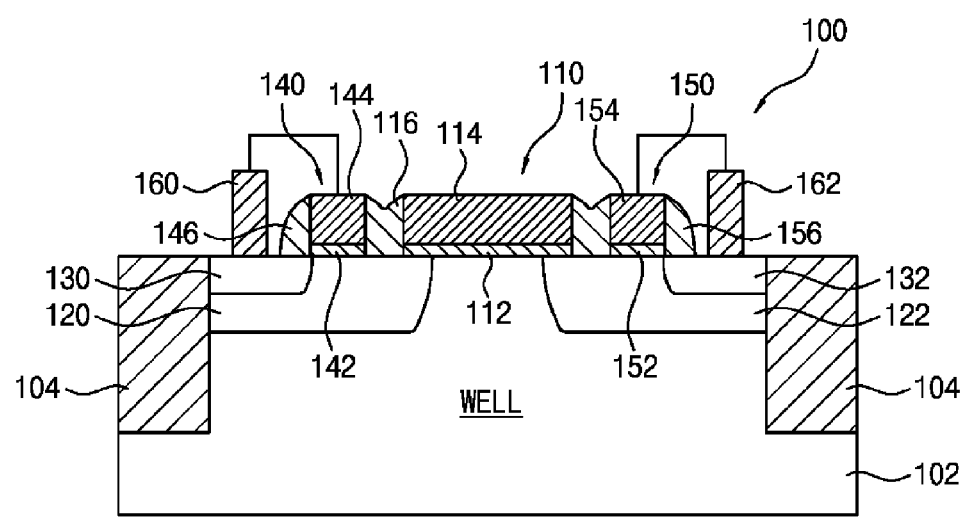
FIG. 2 is a cross-sectional view illustrating a high voltage semiconductor device according to an embodiment.

Referring to FIG. 2, a cross-sectional view of a high voltage semiconductor device is shown according to an embodiment. In embodiments, a high voltage semiconductor device 100, such as a DEMOS device, may include a gate structure 110 formed on a substrate 102, a first drift region 120 formed at a surface portion of the substrate 102 adjacent to one side of the gate structure 110, a source region 130 formed at a surface portion of the first drift region 120 spaced from the gate structure 110, a second drift region 122 formed at a surface portion of the substrate 102 adjacent to another side of the gate structure 110, a drain region 132 formed at a surface portion of the second drift region 122 spaced from the gate structure 110, a first electrode structure 140 formed on the first drift region 120 between the gate structure 110 and the source region 130, and a second electrode structure 150 formed on the second drift region 122 between the gate structure 110 and the drain region 132.

The substrate 102 may include a well region (WELL) used as an active region and device isolation regions 104 formed by a Shallow Trench Isolation (STI) process. Particularly, the gate structure 110 may be formed on the well region, and the first and second drift regions 120 and 122 may be formed at surface portions of the well region.

For example, a first and second low-concentration impurity region having a first conductive type, e.g., N-type, may be used as the first and second drift regions 120 and 122, and a first and second high-concentration impurity region having the first conductive type may be used as the source and drain regions 130 and 132. Further, an impurity region having a second conductive type, e.g., P-type, may be used as the well region.

The gate structure 110 may include a gate insulating layer 112 formed on the well region of the substrate 102 and a gate electrode 114 formed on the gate insulating layer 112. The first electrode structure 140 may include a first insulating layer pattern 142 formed on the first drift region 120 and a first electrode pattern 144 formed on the first insulating layer pattern 142. The second electrode structure 150 may include a second insulating layer pattern 152 formed on the second drift region 122 and a second electrode pattern 154 formed on the second insulating layer pattern 152.

In embodiments, the first and second insulating layer patterns 142 and 152 may be formed of a same material as the gate insulating layer 112, and the first and second electrode patterns 144 and 154 may be formed of a same material as the gate electrode 114. For example, the gate insulating layer 112 and the first and second insulating layer patterns 142 and 152 may be formed of silicon oxide, and the gate electrode 114 and the first and second electrode patterns 144 and 154 may be formed of doped poly-silicon having the first conductive type.

A gate spacer 116 may be formed on side surfaces of the gate structure 110, and first and second electrode spacers 146 and 156 may be formed on side surfaces of the first and second electrode structures 140 and 150, respectively. Particularly, spaces between the gate structure 110 and the first and second electrode structures 140 and 150 may be filled up with the gate spacer 116 and the first and second electrode spacers 146 and 156.

In embodiments, the gate spacer 116 and the first and second electrode spacers 146 and 156 may function as silicide blocking layers. For example, the gate spacer 116 and first and second electrode spacers 146 and 156 may prevent metal silicides from being formed on surface portions of the first and second drift regions 120 and 122 between the gate structure 110 and the first and second electrode structures 140 and 150 during a metal silicidation process, which is performed to form metal silicides on the gate electrode 114 and the source and drain regions 130 and 132.

In one embodiment, the source region 130 may be electrically connected with the first electrode structure 140, and the drain region 132 may be electrically connected with the second electrode structure 150. Thus, when drain voltage is applied to the drain region 132, a vertical electric field may be generated in the second drift region 122 under the second electrode structure 150 due to the drain voltage. Additionally, the drift velocity of electrons may thus be reduced between the source and drain regions 130 and 132, as well as in the second drift region 122. As a result, the impact ionization may also be sufficiently reduced, and further the leakage current through the substrate 102 may be sufficiently reduced.

In embodiments, a first and second contact plug 160 and 162 may be formed on the source and drain regions 130 and 132. Further, in other embodiments, metal silicides (not shown) may be formed between the source and drain regions 130 and 132 and first and second contact plugs 160 and 162 to reduce contact resistance.

Figure 3:
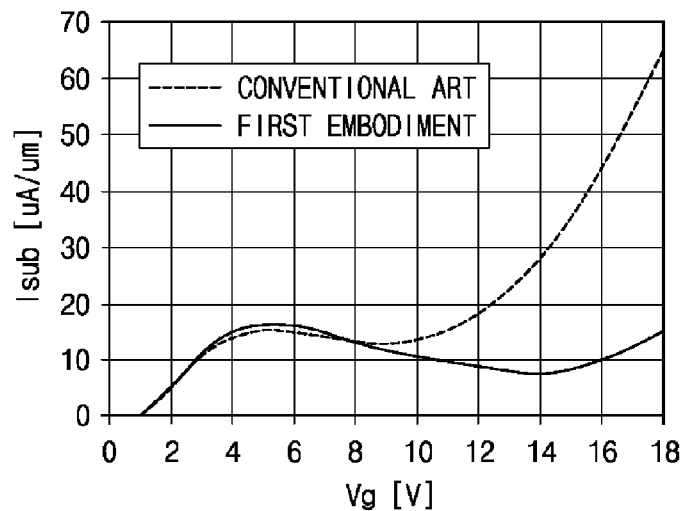
FIG. 3 is a graph illustrating leakage current of the conventional DEMOS device as shown in FIG. 1 and leakage current of the high voltage semiconductor device as shown in FIG. 2.

Referring to FIG. 3, a graphical illustration of leakage current of the conventional DEMOS device as shown in FIG. 1 and leakage current of the high voltage semiconductor device as shown in FIG. 2 is depicted. For example, referring now to FIG. 1, when a gate voltage Vg applied to the gate structure 20 is increased to 18V in a state in which source voltage Vs of 0V and drain voltage Vd of 18V are applied to the source and drain regions 40 and 42 of the DEMOS device 10 as shown in FIG. 1, respectively, a leakage current Isub through the substrate 12 is increased to approximately 65 μA/μm. However, in case of the high voltage semiconductor device 100 (refer, e.g., to FIG. 2), a leakage current Isub through the substrate 102 is reduced to approximately 15 μA/μm.

Figure 4:
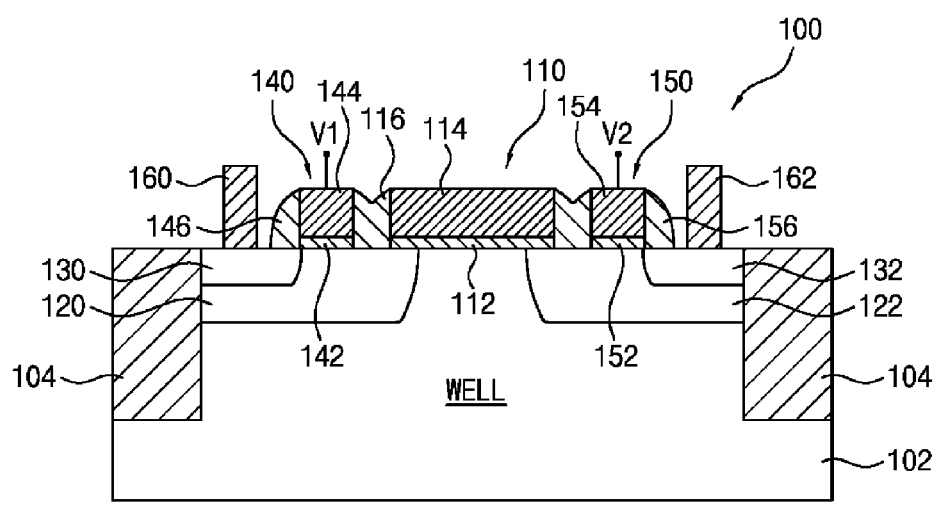
FIG. 4 is a cross-sectional view illustrating a high voltage semiconductor device according to an embodiment.

Referring to FIG. 4, a cross-sectional view of a high voltage semiconductor device is shown according to an embodiment. In embodiments, a first voltage V1 may be applied to the first electrode structure 140, and a second voltage V2 may be applied to the second electrode structure 150 to generate a vertical electric field in the second drift region 122 between the gate structure 110 and the drain region 132. In one embodiment, the second voltage V2 may be equal to a drain voltage Vd. In another embodiment, the second voltage V2 may be higher than a source voltage Vs and lower than the drain voltage Vd.

Similarly, in some embodiments, the first voltage V1 may be equal to the source voltage Vs. While in other embodiments, the first voltage V1 may be equal to the drain voltage Vd or the second voltage V2. As such, an additional vertical electric field may be generated in the first drift region 120 between the gate structure 110 and the source region 130.

Figure 5:
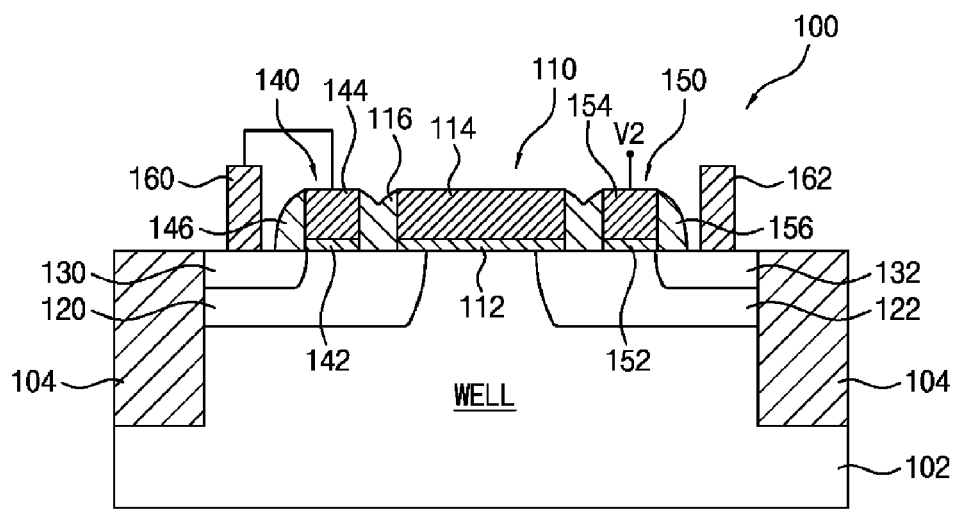
FIG. 5 is a cross-sectional view illustrating a high voltage semiconductor device according to an embodiment.
Figure 6:
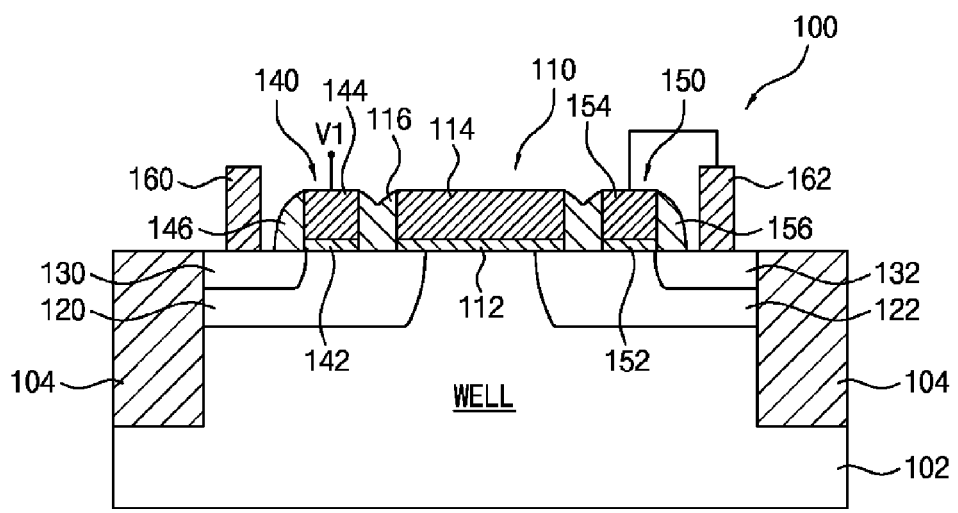
FIG. 6 is a cross-sectional view illustrating a high voltage semiconductor device according to an embodiment.

Referring to FIGS. 5 and 6, a cross-sectional view of a high voltage semiconductor device is shown according to an embodiment. As depicted in FIG. 5, in embodiments, the first electrode structure 140 may be electrically connected with the source region 130, and a second voltage V2 may be applied to the second electrode structure 150 to generate a vertical electric field in the second drift region 122 between the gate structure 110 and the drain region 132, but may vary in other embodiments. For example, in the embodiment of FIG. 6, a first voltage V1 may be applied to the first electrode structure 140, and the second electrode structure 150 may be electrically connected with the drain region 132 to generate a vertical electric field in the second drift region 122 between the gate structure 110 and the drain region 132.

In some embodiments, the first voltage V1 may be equal to the source voltage Vs, while in other embodiments, the first voltage V1 may be equal to the drain voltage Vd. As such, an additional vertical electric field may be generated in the first drift region 120 between the gate structure 110 and the source region 130.

Figure 7:
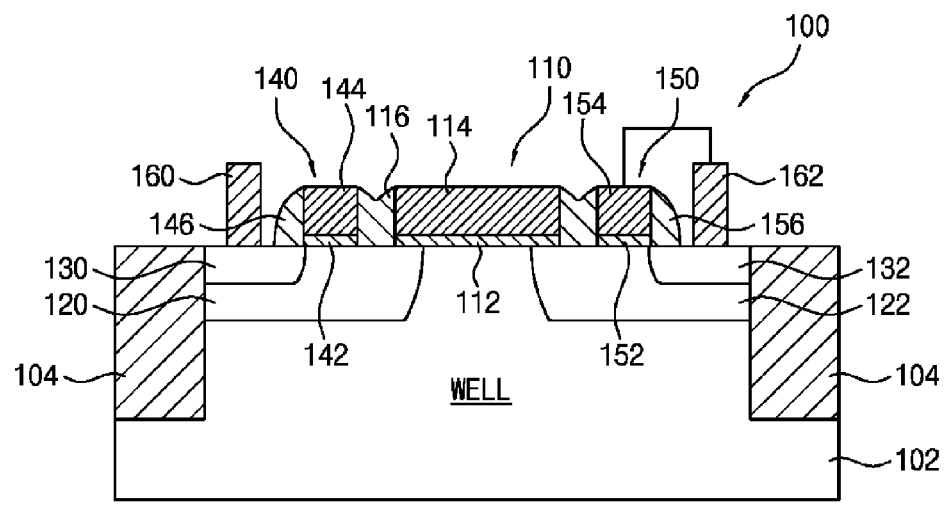
FIG. 7 is a cross-sectional view illustrating a high voltage semiconductor device according to an embodiment.

Referring to FIG. 7, a cross-sectional view of a high voltage semiconductor device is shown according to an embodiment. In embodiments, the first electrode structure 140 may be electrically floated, and the second electrode structure 150 may be electrically connected with the drain region 132 to generate a vertical electric field in the second drift region 122 between the gate structure 110 and the drain region 132.

Figure 8:
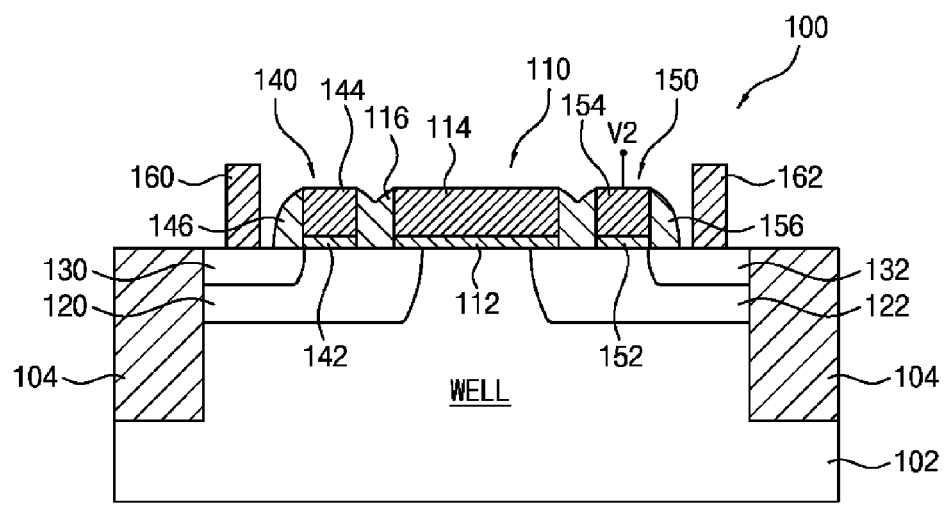
FIG. 8 is a cross-sectional view illustrating a high voltage semiconductor device according to an embodiment.

Referring to FIG. 8, a cross-sectional view of a high voltage semiconductor device is shown according to an embodiment. In embodiments, the first electrode structure 140 may be electrically floated, and a second voltage V2 may be applied to the second electrode structure 150 to generate a vertical electric field in the second drift region 122 between the gate structure 110 and the drain region 132.

Figure 9:
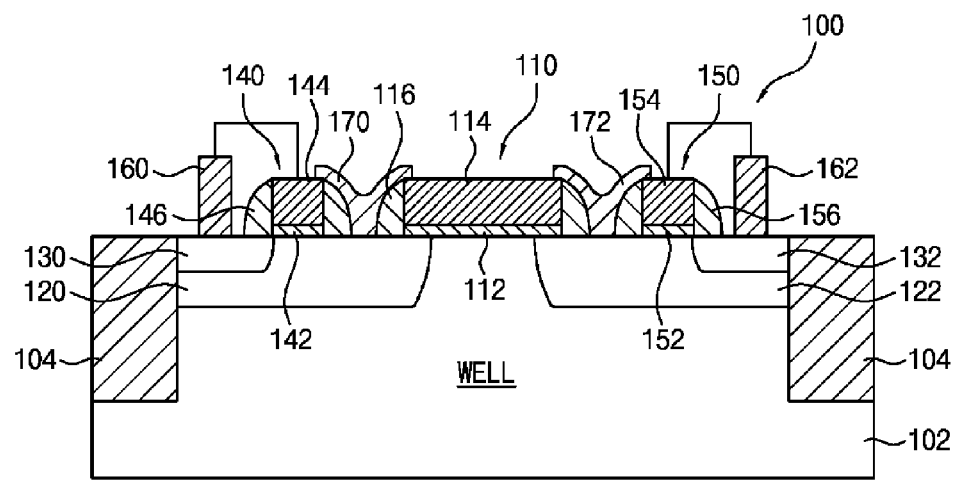
FIG. 9 is a cross-sectional view illustrating a high voltage semiconductor device according to an embodiment.

Referring to FIG. 9, a cross-sectional view of a high voltage semiconductor device is shown according to an embodiment. As illustrated in FIG. 9, surface portions of the first and second drift regions 120 and 122 may be exposed between the gate structure 110 and the first and second electrode structures 140 and 150. In accordance with a seventh exemplary embodiment, third and fourth insulating layer patterns 170 and 172, which function as silicide blocking layers, may be formed on the surface portions of the first and second drift regions 120 and 122 exposed between the gate structure 110 and the first and second electrode structures 140 and 150.

Figure 10:
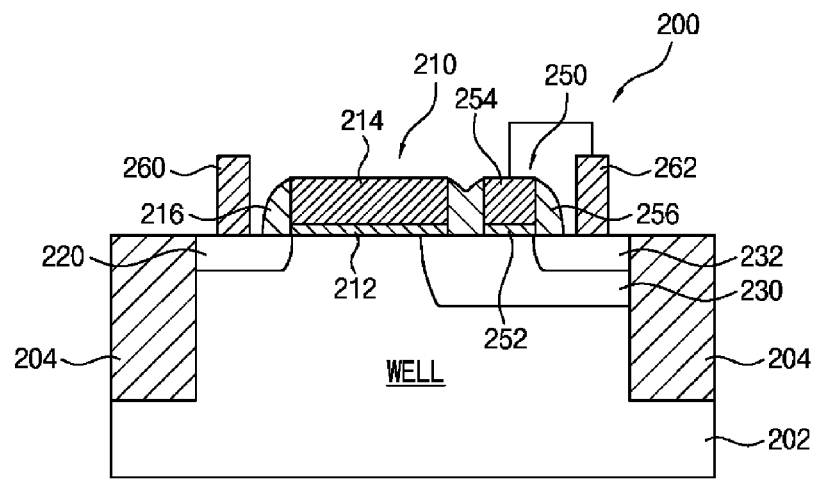
FIG. 10 is a cross-sectional view illustrating a high voltage semiconductor device according to an embodiment.

Referring to FIG. 10, a cross-sectional view of a high voltage semiconductor device is shown according to an embodiment. In embodiments, high voltage semiconductor device 200 may include a gate structure 210 formed on a substrate 202, a source region 220 formed at a surface portion of the substrate 202 adjacent to one side of the gate structure 210, a drift region 230 formed at a surface portion of the substrate 202 adjacent to another side of the gate structure 210, a drain region 232 formed at a surface portion of the drift region 230 spaced from the gate structure 210, and an electrode structure 250 formed on the drift region 230 to generate a vertical electric field between the gate structure 210 and the drain region 232.

A gate spacer 216 may be formed on side surfaces of the gate structure 210, and an electrode spacer 256 is formed on side surfaces of the electrode structure 250. Particularly, a space between the gate structure 210 and the electrode structure 250 may be filled up with the gate spacer 216 and the electrode spacer 256.

In some embodiments, the electrode structure 250 may be electrically connected with the drain region 232 to generate the vertical electric field under the electrode structure 250, i.e., in the drift region 230 between the gate structure 210 and the drain region 232.

The gate structure 210 may include a gate insulating layer 212 formed on a well region (WELL) of the substrate 202 and a gate electrode 214 formed on the gate insulating layer 212. The electrode structure 250 may include an insulating layer pattern 252 formed on the drift region 230 and an electrode pattern 254 formed on the insulating layer pattern 252.

The insulating layer pattern 252 may be formed of the same material as the gate insulating layer 212, and the electrode pattern 254 may be formed of the same material as the gate electrode 214. For example, the gate insulating layer 212 and the insulating layer pattern 252 may be formed of silicon oxide, and the gate electrode 214 and the electrode pattern 254 may be formed of doped poly-silicon.

Figure 11:
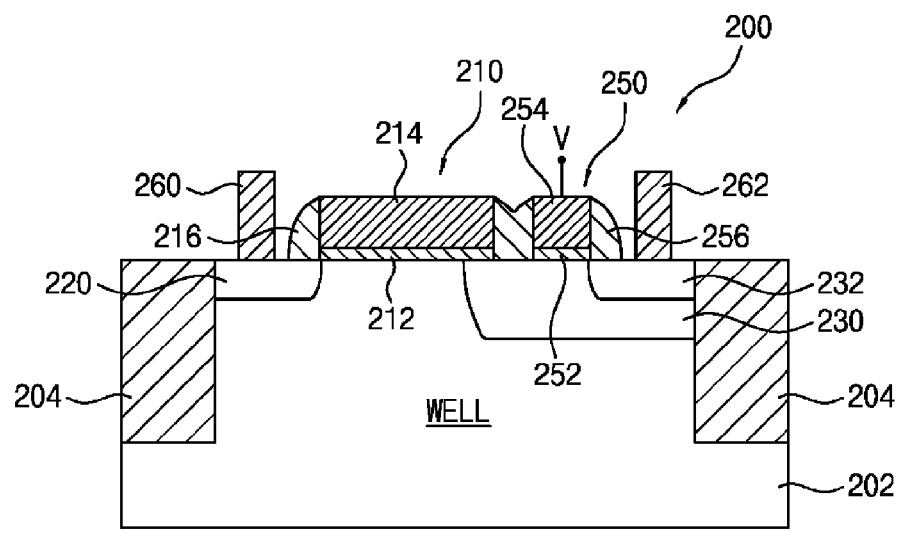
FIG. 11 is a cross-sectional view illustrating a high voltage semiconductor device according to an embodiment.

Referring to FIG. 11, a cross-sectional view of a high voltage semiconductor device is shown according to an embodiment. As illustrated in FIG. 11, a voltage V may be applied to the electrode structure 250 to generate a vertical electric field under the electrode structure 250, i.e., in the drift region 230 between the gate structure 110 and the drain region 232.

Figure 12:
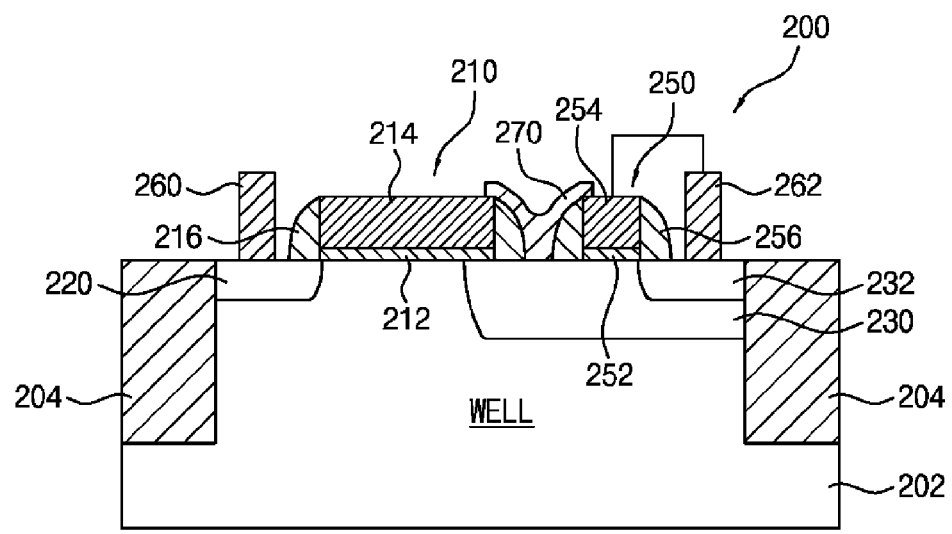
FIG. 12 is a cross-sectional view illustrating a high voltage semiconductor device according to an embodiment.

Referring to FIG. 12, a cross-sectional view of a high voltage semiconductor device is shown according to an embodiment. As illustrated in FIG. 12, a surface portion of the drift region 230 may be exposed between the gate structure 210 and the electrode structures 250. In embodiments, a second insulating layer pattern 270, which function as a silicide blocking layer, may be formed on the surface portion of the drift regions 230 exposed between the gate structure 210 and the electrode structure 250.

As described above, though the DEMOS devices 100 and 200 having the first conductive type, e.g., N-type, are described, the exemplary embodiments of the claimed invention may be employed for P-type DEMOS devices as well. That is, the P-type DEMOS devices may include P-type drift regions and P-type source/drain regions.

Figure 13:
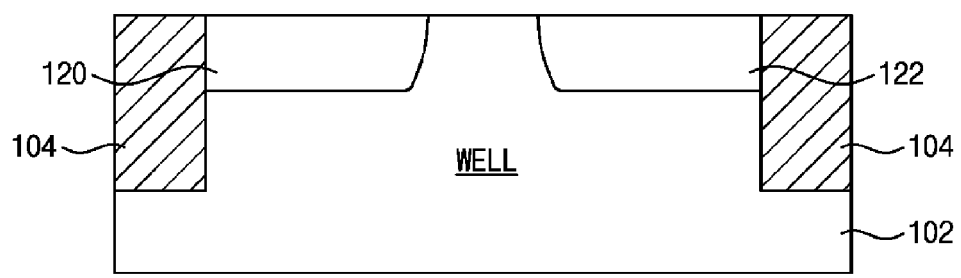
FIGS. 13 to 16 are cross-sectional views illustrating a method of manufacturing a high voltage semiconductor device as shown in FIG. 2.

Referring now to FIGS. 13-16, various cross-sectional views illustrating a step-by-step process of manufacturing the high voltage semiconductor device as shown in FIG. 2 are depicted. As illustrated in FIG. 13, in some embodiments, a well region (WELL) having a second conductive type, e.g., P-type, may be formed at a surface portion of a substrate 102, and an active region may be defined by forming device isolation regions 104. The well region may be formed by an ion implantation process, and the device isolation regions 104 may be formed by a STI process.

First and second drift regions 120 and 122 may be formed at surface portions of the active region of the substrate 102 to be spaced from each other. For example, first and second low-concentration impurity regions having a first conductive type, e.g., N-type, may be formed at the surface portions of the active region, which may be used as the first and second drift regions 120 and 122, respectively.

Figure 14:
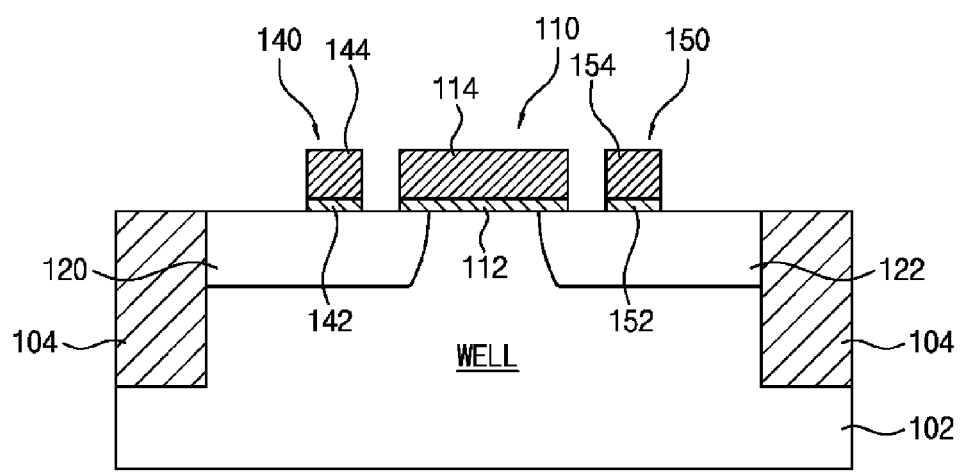

Referring to FIG. 14, in embodiments, a gate structure 110 may be formed on the active region of the substrate 102 to be disposed between the first and second drift regions 120 and 122. Further, first and second electrode structures 140 and 150 may be formed on the first and second drift regions 120 and 122 to be spaced from both sides of the gate structure 110, respectively.

For example, an insulating layer (not shown) and a conductive layer (not shown) may be sequentially formed on the substrate 102, and the gate structure 110 and the first and second electrode structures 140 and 150 may then be acquired by patterning the insulating layer and the conductive layer. For example, a silicon oxide layer may be used as the insulating layer, and a doped poly-silicon layer having the first conductive type, i.e., N-type, may be used as the conductive layer.

The gate structure 110 may include a gate insulating layer 112 and a gate electrode 114 disposed on the gate insulating layer 112, and the first and second electrode structures 140 and 150 may include first and second insulating layer patterns 142 and 152 and first and second electrode patterns 144 and 154 disposed on the first and second insulating layer patterns 142 and 152, respectively.

Figure 15:
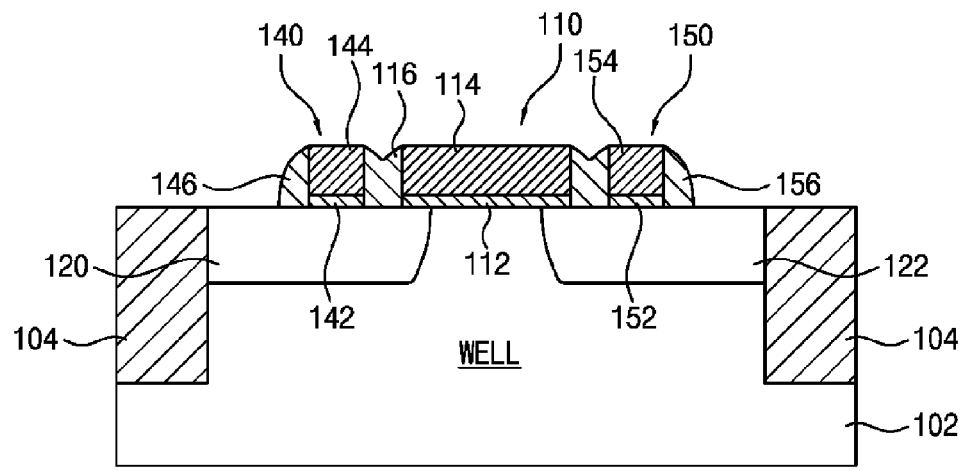

Referring to FIG. 15, a gate spacer 116 and first and second electrode spacers 146 and 156 may be formed on side surfaces of the gate structure 110 and the first and second electrode structures 140 and 150, respectively. Once the structures are formed, in some embodiments, spaces between the gate structure 110 and the first and second electrode structures 140 and 150 may be filled up with the gate spacer 116 and the first and second electrode spacers 146 and 156.

In other embodiments, however, when surface portions of the first and second drift regions 120 and 122 are partially exposed between the gate spacer 116 and the first and second electrode spacers 146 and 156, third and fourth insulating layer patterns 170 and 172 (See FIG. 9) may be formed on the exposed surface portions of the first and second drift regions 120 and 122. The third and fourth insulating layer patterns 170 and 172 may be used as silicide blocking layers during a subsequent metal silicidation process.

Figure 16:
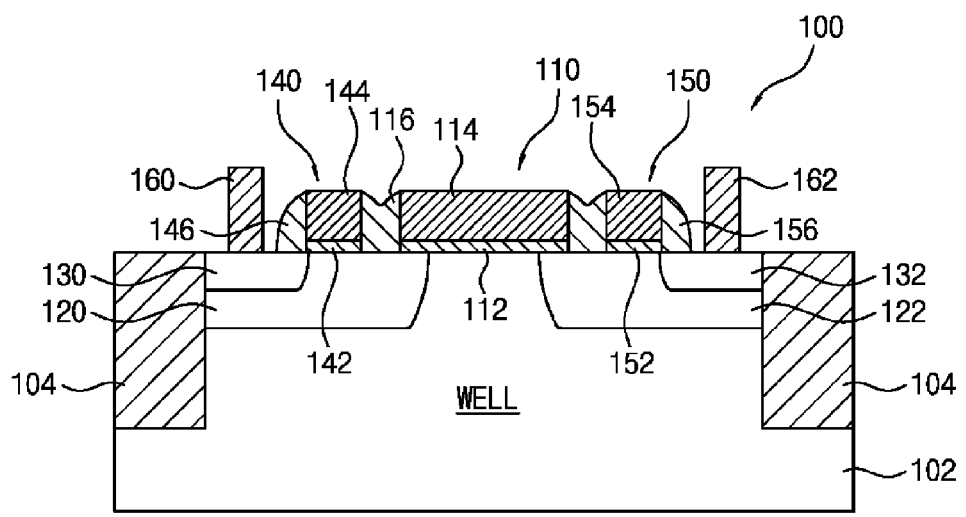

Referring to FIG. 16, in embodiments, source and drain regions 130 and 132 may be formed at surface portions of the first and second drift regions 120 and 122, respectively. For example, first and second high-concentration impurity regions having the first conductive type, i.e., N-type, may be formed at the surface portions of the first and second drift regions 120 and 122, which may be used as the source and drain regions 130 and 132, respectively. Particularly, as shown in FIG. 16, the gate structure 110 and the first and second electrode structures 140 and 150 may be disposed between the source and drain regions 130 and 132. Further, the first electrode structure 140 may be disposed between the gate structure 110 and the source region 130, and the second electrode structure 150 may be disposed between the gate structure 110 and the drain region 132.

Although not shown in the figures, in still other embodiments, metal silicides may be formed on the gate electrode 114, the source and drain regions 130 and 132, and the first and second electrode patterns 144 and 154 by a metal silicidation process. For example, titanium silicides may be formed on the gate electrode 114, the source and drain regions 130 and 132, and the first and second electrode patterns 144 and 154.

After forming the metal silicides, an interlayer insulating layer (not shown) may be formed on the substrate 102, and a first and second contact plug 160 and 162 may then be formed through the interlayer insulating layer to be connected with the source and drain regions 130 and 132, respectively. Further, in other embodiments, a third and fourth contact plug (not shown) may be formed through the interlayer insulating layer to be connected with the first and second electrode structures 140 and 150, respectively. In embodiments, metal wirings (not shown) may also be formed on the interlayer insulating layer to electrically connect the first and second electrode structures 140 and 150 with the source and drain regions 130 and 132, respectively.

Similar to FIGS. 13-16 discussed above, FIGS. 17 to 20 illustrate various cross-sectional views of a step-by-step process of manufacturing the high voltage semiconductor device as shown in FIG. 10.

Figure 17:
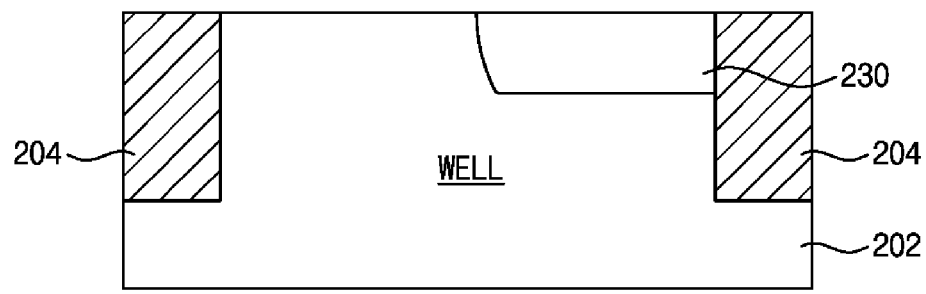
FIGS. 17 to 20 are cross-sectional views illustrating a method of manufacturing a high voltage semiconductor device as shown in FIG. 10.

As illustrated in FIG. 17, as an initial step, a well region (WELL) having a second conductive type, e.g., P-type, may be formed at a surface portion of a substrate 202, and an active region may be defined by forming device isolation regions 204. The well region may be formed by an ion implantation process, and the device isolation regions 204 may be formed by a STI process.

A drift region 230 may be formed at a surface portion of the active region of the substrate 202. For example, a low-concentration impurity region having a first conductive type, e.g., N-type, may be formed at the surface portion of the active region, which may be used as the drift region 230.

Figure 18:
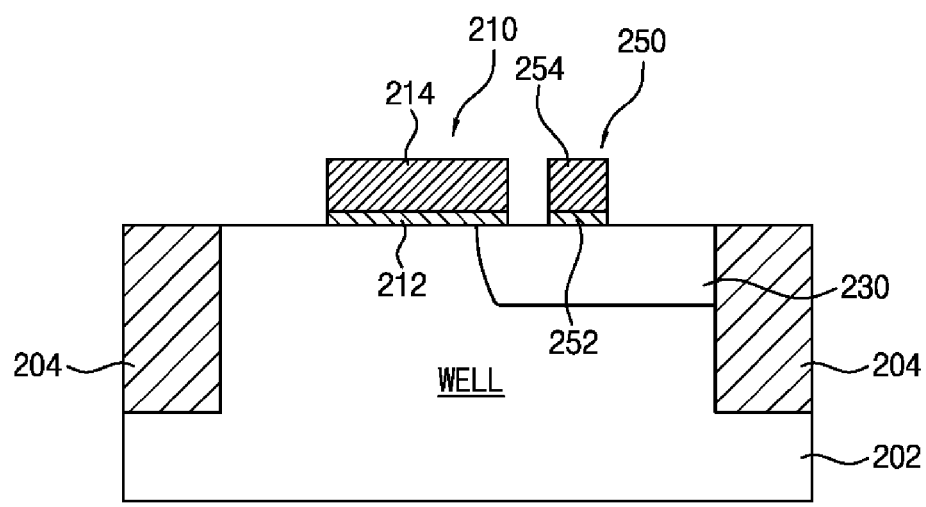

Next, as illustrated in FIG. 18, a gate structure 210 may be formed on the active region of the substrate 202 to be disposed adjacent to the drift region 230, and an electrode structure 250 may be formed on the drift region 230 to be spaced from the gate structure 210. For example, an insulating layer (not shown) and a conductive layer (not shown) may be sequentially formed on the substrate 202, and the gate structure 210 and the electrode structure 250 may then be acquired by patterning the insulating layer and the conductive layer. For example, a silicon oxide layer may be used as the insulating layer, and a doped poly-silicon layer having the first conductive type, i.e., N-type, may be used as the conductive layer.

The gate structure 210 may include a gate insulating layer 212 and a gate electrode 214 disposed on the gate insulating layer 212, and the electrode structure 250 may include an insulating layer pattern 252 and an electrode pattern 254 disposed on the insulating layer pattern 252.

Figure 19:
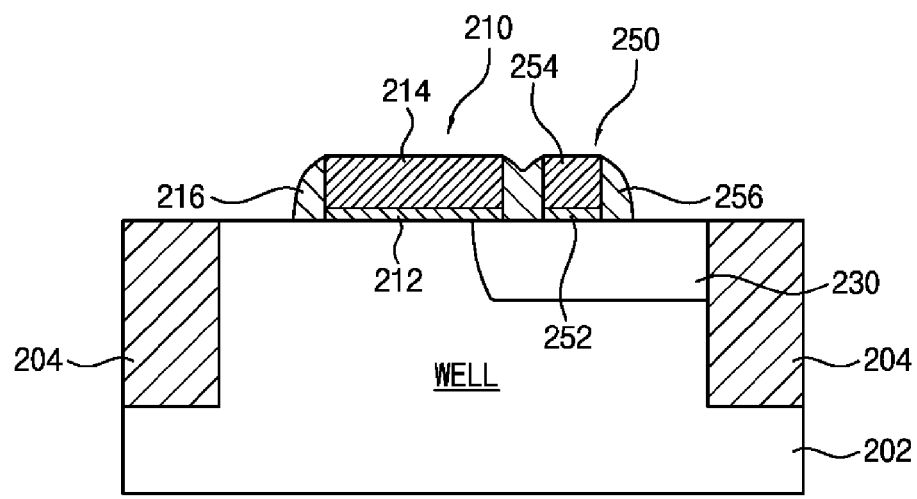

Referring now to FIG. 19, once the gate structure has been formed, a gate spacer 216 and an electrode spacer 256 may be formed on side surfaces of the gate structure 210 and the electrode structure 250, respectively. In some embodiments, a space between the gate structure 210 and the electrode structure 250 may be filled up with the gate spacer 216 and the electrode spacer 256.

In other embodiments, when a surface portion of the drift region 230 is partially exposed between the gate spacer 216 and the electrode spacer 256, a second insulating layer pattern 270 (See FIG. 12) may be formed on the exposed surface portion of the drift region 230. The second insulating layer pattern 270 may be used as a silicide blocking layer during a subsequent metal silicidation process.

Figure 20:
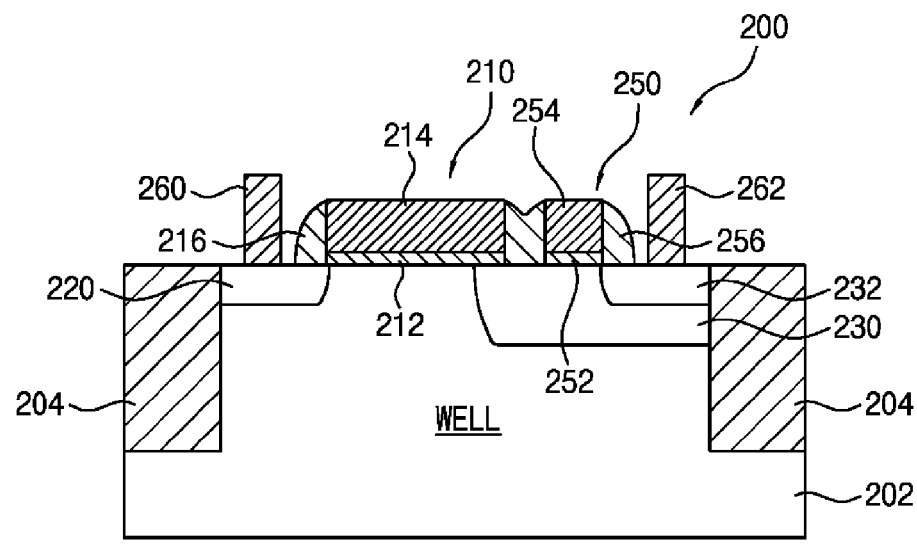

Finally, as illustrated in FIG. 20, a source and drain region 220 and 232 may be formed at a surface portion of the substrate 202 adjacent to the gate structure 210 and a surface portion of the drift region 230 adjacent to the electrode structure 250, respectively. For example, first and second high-concentration impurity regions having the first conductive type, i.e., N-type, may be formed at the surface portion of the substrate 202 adjacent to the gate structure 210 and the surface portion of the drift region 230 adjacent to the electrode structure 250, which may be used as the source and drain regions 220 and 232, respectively. Particularly, as shown in FIG. 20, the gate structure 210 and the electrode structure 250 may be disposed between the source and drain regions 220 and 232.

As discussed with reference to FIG. 16, although not depicted, in some embodiments, metal silicides may be formed on the gate electrode 214, the source and drain regions 220 and 232, and the electrode pattern 254 by a metal silicidation process. For example, titanium silicides may be formed on the gate electrode 214, the source and drain regions 220 and 232 and the electrode pattern 254.

In still other embodiments, after forming the metal silicides, an interlayer insulating layer (not shown) may be formed on the substrate 202, and first and second contact plugs 260 and 262 may then be formed through the interlayer insulating layer to be connected with the source and drain regions 220 and 232, respectively. Further, in other embodiments, a third contact plug (not shown) may be formed through the interlayer insulating layer to be connected with the electrode structure 250, and a metal wiring (not shown) may be formed on the interlayer insulating layer to electrically connect the electrode structure 250 with the drain region 232.

In accordance with the various embodiments of the claimed invention as described above, a high voltage semiconductor may include a drift region formed at a surface portion of a substrate to be adjacent to a gate structure and a drain region formed at a surface portion of the drift region. Particularly, an electrode structure may be formed on the drift region between the gate structure and the drain region to generate a vertical electric field under the electrode structure.

The drift velocity of electrons in the drift region between the gate structure and the drain region may be sufficiently reduced by the vertical electrical field. As a result, the impact ionization may be sufficiently reduced in the drift region and/or the drain region, and the leakage current through the substrate may thus be sufficiently reduced.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112(f) of 35 U.S.C. are not to be invoked unless the specific terms "means for" or "step for" are recited in a claim.

What is claimed is:

1. A high voltage semiconductor device comprising:
   a gate structure disposed on a substrate;
   a first drift region disposed at a surface portion of the substrate adjacent to one side of the gate structure;
   a source region disposed at a surface portion of the first drift region spaced from the gate structure;
   a second drift region disposed at a surface portion of the substrate adjacent to another side of the gate structure;
   a drain region disposed at a surface portion of the second drift region spaced from the gate structure;
   a first electrode structure disposed on the first drift region between the gate structure and the source region; and
   a second electrode structure disposed on the second drift region between the gate structure and the drain region.

2. The high voltage semiconductor device of claim 1, wherein a gate spacer is disposed on side surfaces of the gate structure, a first electrode spacer is disposed on side surfaces of the first electrode structure, and a second electrode spacer is disposed on side surfaces of the second electrode structure.

3. The high voltage semiconductor device of claim 2, wherein spaces between the gate structure and the first and second electrode structures are filled up with the gate spacer and the first and second electrode spacers.

4. The high voltage semiconductor device of claim 2, wherein first and second insulating layer patterns are disposed on surface portions of the first and second drift regions exposed between the gate spacer and the first and second electrode spacers, respectively.

5. The high voltage semiconductor device of claim 1, wherein the source region and the first electrode structure are electrically connected with each other.

6. The high voltage semiconductor device of claim 1, wherein a first voltage is applied to the first electrode structure.

7. The high voltage semiconductor device of claim 1, wherein the first electrode structure is electrically floated.

8. The high voltage semiconductor device of claim 1, wherein the drain region and the second electrode structure are electrically connected with each other.

9. The high voltage semiconductor device of claim 1, wherein a second voltage is applied to the second electrode structure to generate a vertical electric field between the gate structure and the drain region.

10. The high voltage semiconductor device of claim 1, wherein the gate structure comprises a gate insulating layer disposed on the substrate and a gate electrode formed on the gate insulating layer, and
    wherein the first electrode structure comprises a first insulating layer pattern disposed on the first drift region and a first electrode pattern disposed on the first insulating layer pattern; and
    wherein the second electrode structure comprises a second insulating layer pattern disposed on the second drift region and a second electrode pattern disposed on the second insulating layer pattern.

11. The high voltage semiconductor device of claim 10, wherein the first and second insulating layer pattern are each formed of an insulating layer material, and wherein the first and second electrode pattern are each formed of an electrode material.

12. A method of manufacturing a high voltage semiconductor device, comprising:

forming a first drift region and a second drift region at surface portions of a substrate to be spaced from each other;

forming a gate structure on the substrate between the first and second drift regions;

forming a first electrode structure and a second electrode structure on the first and second drift regions to be spaced from both sides of the gate structure, respectively; and forming a source region and a drain region adjacent to the first and second electrode structures, respectively, wherein the first electrode structure, the gate structure and the second electrode structure are disposed between the source region and the drain region.

\* \* \* \* \*